(12) United States Patent
Chen et al.

(10) Patent No.: US 7,936,625 B2
(45) Date of Patent: May 3, 2011

(54) PIPELINE SENSING USING VOLTAGE STORAGE ELEMENTS TO READ NON-VOLATILE MEMORY CELLS

(75) Inventors: Yiran Chen, Eden Prairie, MN (US); Hai Li, Eden Prairie, MN (US); Harry Hongyue Liu, Maple Grove, MN (US); KangYong Kim, Boise, ID (US); Henry F. Huang, Apple Valley, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 136 days.

(21) Appl. No.: 12/409,671

(22) Filed: Mar. 24, 2009

(65) Prior Publication Data

US 2010/0246250 A1 Sep. 30, 2010

(51) Int. Cl.
*G11C 7/00* (2006.01)

(52) U.S. Cl. ............... 365/205; 365/189.08; 365/189.09; 365/207

(58) Field of Classification Search .................. 365/171, 365/189.09, 208, 210.12, 205, 207, 189.08, 365/191

See application file for complete search history.

(56) References Cited

U.S. PATENT DOCUMENTS

| | | | |
|---|---|---|---|
| 5,875,134 A | 2/1999 | Cloud | |
| 6,118,326 A | 9/2000 | Singer et al. | |
| 6,243,291 B1 | 6/2001 | Cheah | |
| 6,584,003 B1 | 6/2003 | Kim et al. | |
| 6,728,128 B2 | 4/2004 | Nishimura et al. | |
| 7,161,861 B2 | 1/2007 | Gogl et al. | |
| 7,266,029 B2 | 9/2007 | Jeong | |
| 2004/0202020 A1* | 10/2004 | Fujito et al. | 365/185.2 |
| 2005/0052897 A1* | 3/2005 | Luk et al. | 365/149 |
| 2005/0257121 A1* | 11/2005 | Kim et al. | 714/768 |
| 2010/0177551 A1* | 7/2010 | Chen et al. | 365/148 |

OTHER PUBLICATIONS

M. Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Proc. International Electron Device Meeting Tech. Dig., 2005, pp. 473-476, IEEE.

* cited by examiner

*Primary Examiner* — VanThu Nguyen
*Assistant Examiner* — Hien N Nguyen
(74) *Attorney, Agent, or Firm* — Fellers, Snider, et al.

(57) ABSTRACT

Various embodiments are generally directed to a method and apparatus for carrying out a pipeline sensing operation. In some embodiments, a read voltage from a first memory cell is stored in a voltage storage element (VSE) and compared to a reference voltage to identify a corresponding memory state of the first memory cell while a second read voltage from a second memory cell is stored in a second VSE. In other embodiments, bias currents are simultaneously applied to a first set of memory cells from the array while read voltages generated thereby are stored in a corresponding first set of VSEs. The read voltages are sequentially compared with at least one reference value to serially output a logical sequence corresponding to the memory states of the first set of memory cells while read voltages are stored for a second set of memory cells in a second set of VSEs.

20 Claims, 6 Drawing Sheets

BIT WRITE OPERATION

BIT READ OPERATION

STRAM

RRAM

PIPELINE SENSING USING VOLTAGE STORAGE ELEMENTS TO READ NON-VOLATILE MEMORY CELLS

BACKGROUND

Data storage devices generally operate to store and retrieve data in a fast and efficient manner. Some storage devices utilize a semiconductor array of solid-state memory cells to store individual bits of data. Such memory cells can be volatile or non-volatile.

As will be appreciated, volatile memory cells generally retain data stored in memory only so long as operational power continues to be supplied to the device. Non-volatile memory cells generally retain data stored in memory even in the absence of the application of operational power. Non-volatile memory cells can take a variety of constructions, such as spin-torque transfer random access memory (STRAM), resistive RAM (RRAM), flash, etc.

In these and other types of data storage devices, the cells can be configured to have different electrical resistances to store different logical states. The resistance of the cells can be subsequently detected during a read operation by applying a read current and sensing a voltage drop across the cell. While it is generally desirable to carry out read operations quickly, various effects can reduce the overall rate at which data can be read from an array. These effects can include parasitic capacitances associated with the charging of access lines, and overhead time required to configure the cells for a read operation.

SUMMARY

Various embodiments of the present invention are generally directed to a method and apparatus for carrying out a pipeline sensing operation to read data from a semiconductor memory array.

In accordance with some embodiments, a method generally comprises storing a read voltage from a first memory cell in a voltage storage element (VSE); comparing the read voltage to a reference voltage to identify a corresponding memory state of the first memory cell; and storing a second read voltage from a second memory cell in a second VSE during the comparing step to carry out a pipeline sensing operation upon the first and second memory cells.

In accordance with other embodiments, an apparatus generally comprises a memory array of semiconductor memory cells, and a control circuit which carries out a pipeline sense operation to read data from the array by simultaneously applying bias currents to a first set of memory cells from the array while storing read voltages generated thereby in a corresponding first set of voltage storage elements (VSEs), and then sequentially comparing the read voltages stored in said first set of VSEs with at least one reference value to serially output a logical sequence corresponding to the memory states of the first set of memory cells.

In accordance with other embodiments, an apparatus generally comprises a memory array of semiconductor memory cells, and first means for carrying out a pipeline sense operation to read data from the array.

These and various other features and advantages which characterize the various embodiments of the present invention can be understood in view of the following detailed discussion and the accompanying drawings.

DETAILED DESCRIPTION

Figure 1:
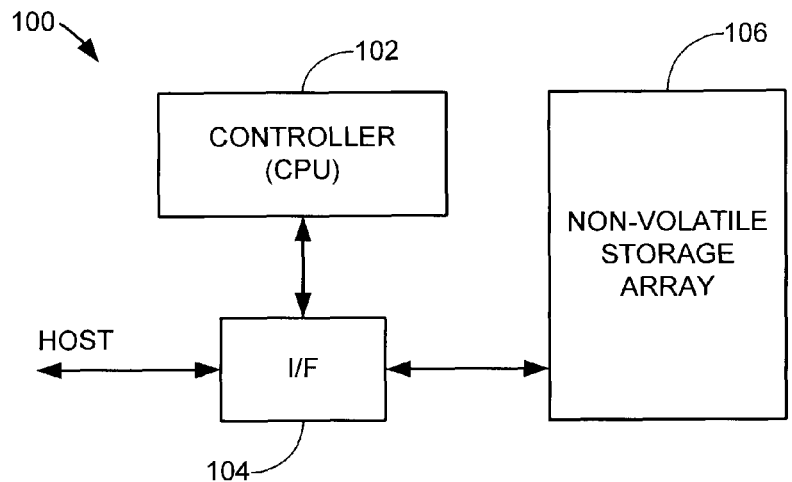
FIG. 1 is a generalized functional representation of an exemplary data storage device constructed and operated in accordance with various embodiments of the present invention.
Figure 2:
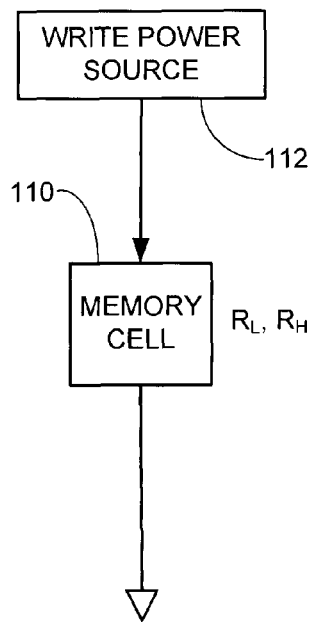
FIG. 2 generally illustrates a manner in which data are written to a memory cell of the memory array of FIG. 1.

FIG. 1 provides a functional block representation of a data storage device 100 to illustrate an exemplary environment in which various embodiments of the present invention can be advantageously practiced. The device 100 includes a top level controller 102, an interface (I/F) circuit 104 and a non-volatile data storage array 106. The I/F circuit 104 operates under the direction of the controller 102 to transfer user data between the array 106 and a host device (not shown). In some embodiments, the device is characterized as a solid-state drive (SSD), the controller 102 is a programmable microcontroller, and the array 106 comprises an array of nonvolatile memory cells (unit cells), one of which is represented in FIG. 2 at 110.

Figure 3:
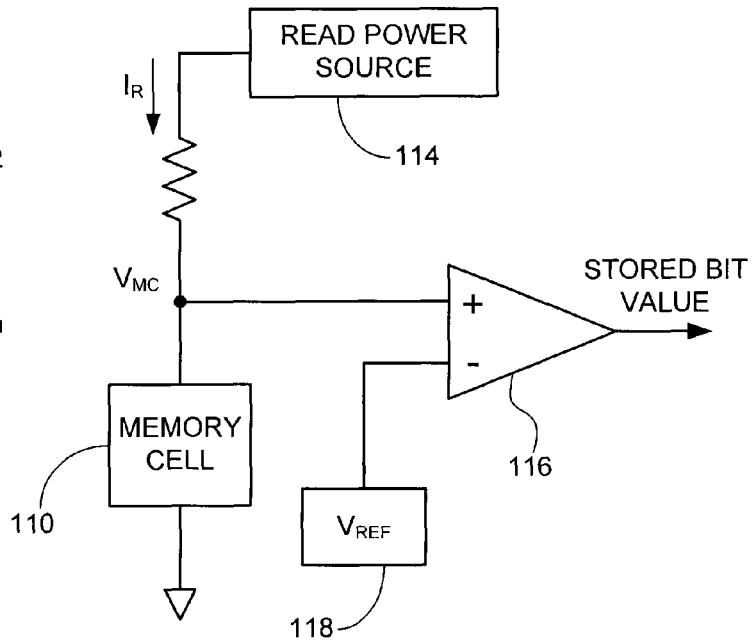
FIG. 3 generally illustrates a manner in which data are read from the memory cell of FIG. 2.

Data are written to the memory cells 110 using a write power source 112 to apply a suitable write input such as in the form of a write voltage and/or current to configure the memory cell 110 to a desired programmed state. The programmed state can be subsequently read from the memory cell 110 as shown in FIG. 3. A read current is supplied from a suitable read current source 114. A voltage drop across the memory cell $V_{MC}$ is sensed by a sense amplifier 116, and compared to a reference voltage $V_{REF}$ from a voltage reference source 118. The output state of the sense amplifier 116 will nominally reflect the programmed state of the memory cell (e.g., a logical 0, a logical 1, a logical "10," etc.).

Figure 4A:
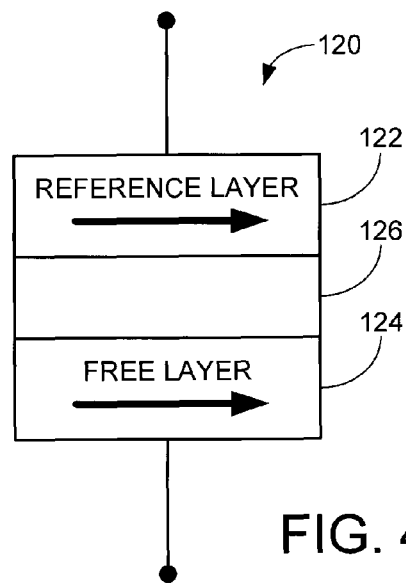
FIGS. 4A-4B show exemplary constructions of a magnetic tunneling junction (MTJ) of a spin-torque transfer random access memory (STRAM) memory cell.
Figure 4B:
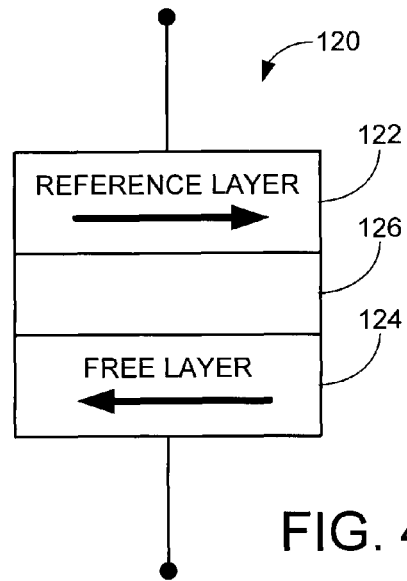

In some embodiments, the memory cells 110 take a spin-torque transfer random access memory (STRAM) configuration, as generally shown in FIGS. 4A-4B.

A resistive sense element (RSE) 120 characterized as a magnetic tunneling junction (MTJ) includes a fixed magnetic reference layer 122 and a free magnetic layer 124 separated by an intervening barrier layer 126. In some embodiments, the reference layer 122 comprises spin polarizing material that orients the spin of current passing through the MTJ 120 in a predetermined direction. The magnetization direction of the reference layer 122 may be pinned to a separate layer (not shown) that maintains the reference layer in a specified magnetic orientation.

The free layer 124 is formed of a suitable magnetic material arranged to have selectively different magnetization directions which are established responsive to the application of different write currents. The intervening barrier layer 126 can take any number of constructions, such as Magnesium Oxide (MgO). While the respective magnetization directions are shown to be substantially perpendicular to the direction of write current, other magnetic orientations, including in-line orientations, can be utilized as desired. Additional layers, including seed layers, shield layers, and secondary free and/or reference layers can be incorporated into the MTJ as desired.

A low resistance state for the MTJ 120 is achieved when the magnetization of the free layer 124 is oriented to be substantially in the same direction (parallel) as the magnetization of the reference layer 122. This orientation is shown in FIG. 4A. To orient the MTJ 120 in the parallel (P) low resistance state, a write current passes through the MTJ 120 so that the magnetization direction of the reference layer 122 sets the magnetic orientation of the free layer 124. Since electrons flow in the direction opposite to the direction of current, the write current direction passes from the free layer 124 to the reference layer 122, so that the electrons travel from the reference layer 122 to the free layer 124.

A high resistance state for the MTJ 120 is shown in FIG. 4B and is characterized as an anti-parallel orientation in which the magnetization direction of the free layer 124 is substantially opposite that of the reference layer 122. To orient the MTJ 120 in the anti-parallel (AP) resistance state, a write current passes through the MTJ 120 from the reference layer 122 to the free layer 124 so that spin-polarized electrons flow into the free layer 124.

A different logical state is assigned to each of the programmable resistances of the MTJ. In some embodiments, the low resistance, parallel (P) state of FIG. 4A is used to represent a logical 0, and the high resistance, anti-parallel (AP) state of FIG. 4B is used to represent a logical 1. Additional programmed states can be used when the MTJ is configured to store multiple bits. For example, programmed resistances R1<R2<R3<R4 can be used to respectively store multi-bit values "00," "01," "10" and "11."

Figure 5A:
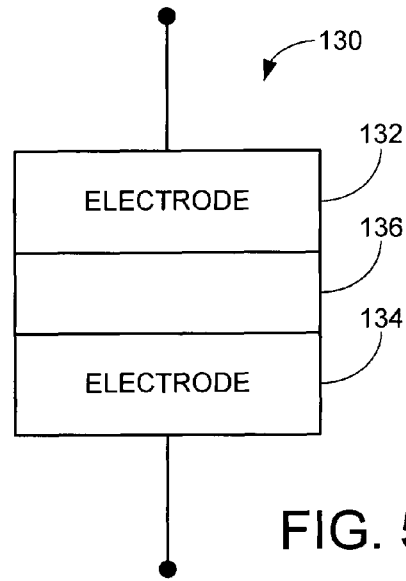
FIGS. 5A-5B show exemplary constructions of a resistive random access memory (RRAM) memory cell.
Figure 5B:
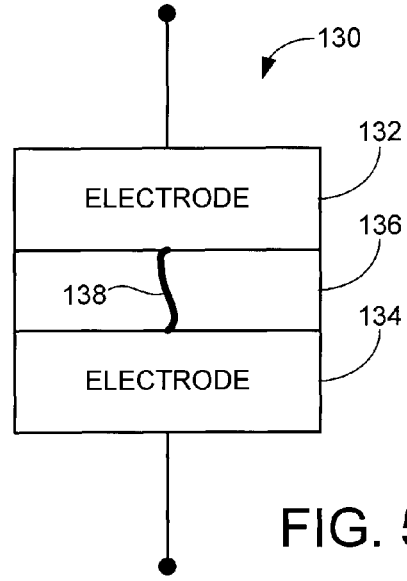

FIGS. 5A and 5B show an alternative construction for the memory cell 110 of FIGS. 2-3 characterized as a resistive random access memory (RRAM) cell. An RRAM resistive sense element (RSE) 130 includes opposing metal or metal alloy electrode layers 132, 134 which are separated by an intervening oxide layer 136. A first, higher resistance programmed state is denoted by FIG. 5A, and a second, lower resistance programmed state is denoted by FIG. 5B.

In FIG. 5A, the relatively higher resistance state is established by the nominal electrical resistance of the oxide layer 136. Application of a suitable write voltage potential and/or write current in a selected direction across the RSE 130 will induce metal migration from the electrode layer 132, forming one or more electrically conductive metallization filaments 138 through the oxide layer as shown in FIG. 5B.

Such filaments generally operate to lower the characteristic resistance of the cell. To return the programmed state of the RSE 130 to the high resistance state of FIG. 5A, an appropriate write voltage potential and/or current is applied through the RSE 130 in the opposite direction.

In order to read a memory cell 110 such as the STRAM cell of FIGS. 4A-4B or the RRAM cell of FIGS. 5A-5B, various steps may be required to be carried out in turn. These steps may include: the pre-charging of the associated bit line to an initial pre-determined voltage level, the charging of the bit line by read current (in a current mode) or a voltage driver (in a voltage mode), the enabling of the sense amplifier, the actual sensing and comparison by the amplifier to output the memory state, and the latching of the output memory state in a buffer or other location. If self-reference is used, additional time may be required to generate and store the appropriate $V_{REF}$ for use by the sense amplifier.

The charging time for the bit line can be relatively long due to parasitic capacitances and other effects, particularly when the size of the memory block being accessed is relatively large. The use of self-reference schemes can also increase the time required to carry out a read operation due to the timing overhead required to configure the circuit (extra read/write operations, etc.).

Accordingly, various embodiments of the present invention are generally directed to the implementation of a pipeline sensing scheme to improve the read throughput performance of a memory array. This scheme generally reduces the delays associated with the reading of data, including the bit line charging delays and self-reference overhead operations discussed above.

Figure 6:
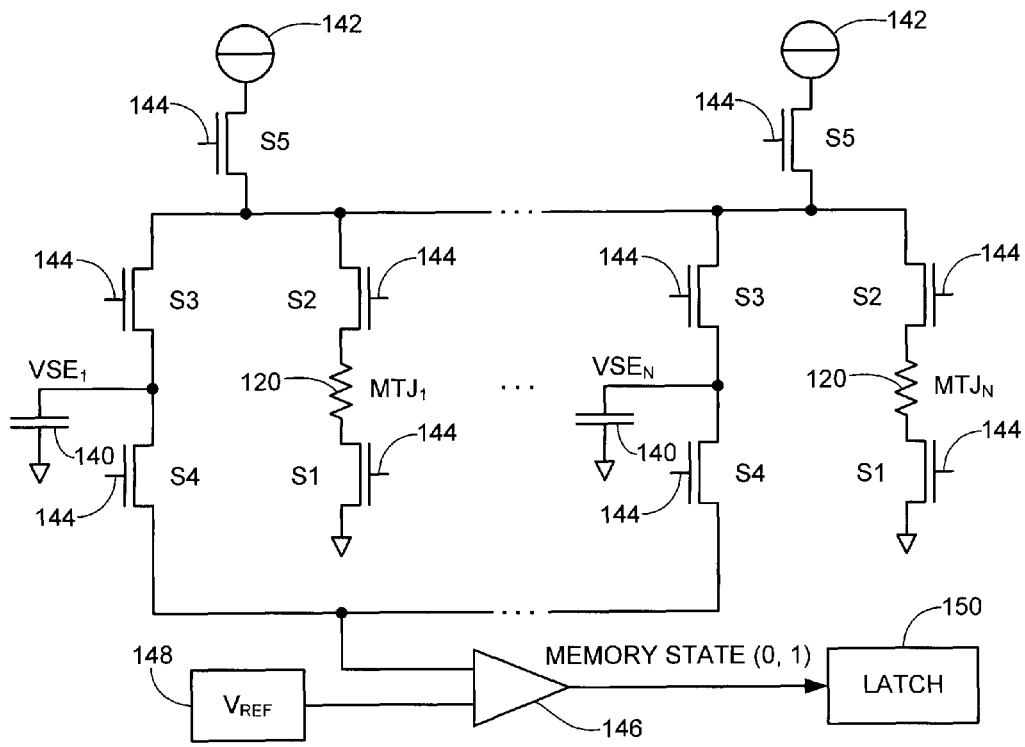
FIG. 6 sets forth a schematic representation of a manner in which data are read from the memory array in accordance with various embodiments of the present invention in which an external reference is used.

FIG. 6 shows a schematic representation of a portion of the memory device array of FIG. 1 in accordance with some embodiments. FIG. 6 utilizes STRAM memory cells with MTJs 120 as set forth in FIGS. 4A-4B, although other configurations of memory cells could be alternatively used. FIG. 6 represents circuitry for N memory cells ($MTJ_1$ to $MTJ_N$).

Voltage storage elements (VSEs) 140 are coupled to the bit lines of the MTJs 120. The VSEs 140 are characterized as capacitors in FIG. 6, although other constructions can alternatively be used. One VSE 140 can be provisioned for each MTJ 120, or multiple MTJs 120 can selectively utilize a common VSE 140 in turn to save space. Other elements in FIG. 6 include respective current sources 142, switches S1-S5 (transistors) 144, comparator (sense amplifier) 146, an external $V_{REF}$ current source 148, and output latch 150.

During a read operation, multiple ones of the MTJs 120 are accessed simultaneously through the application of read current by the sources 142 thereto via associated bit lines (BL). The corresponding read voltages from the MTJs (e.g., the voltage drops from bit lines BL to source lines SL) are simultaneously stored in the VSEs 140. The read current from the respective sources 142 is thereafter removed from the bit lines, and the sense amplifier 146 is sequentially enabled to sense the voltage of each of the VSEs 140 serially in turn.

While the sense amplifier 146 operates to serially output the memory states of the first group of MTJs to the latch 150, the circuitry of FIG. 6 repeats the foregoing operation on a next set of memory cells. In this way, the circuitry generally operates to read a first memory cell to obtain a first read voltage indicative of a memory state of the first cell, to store the first read voltage in a first voltage storage element (VSE), and to sense the read voltage in the first VSE to identify said memory state while a second memory cell is read and a second read voltage therefor is stored in a second VSE for subsequent sensing thereof to carry out a pipeline reading of said memory cells. In some embodiments, multiple cells are simultaneously read and read voltages therefor are simultaneously stored, after which the read voltages are sequentially sensed.

Figure 7:
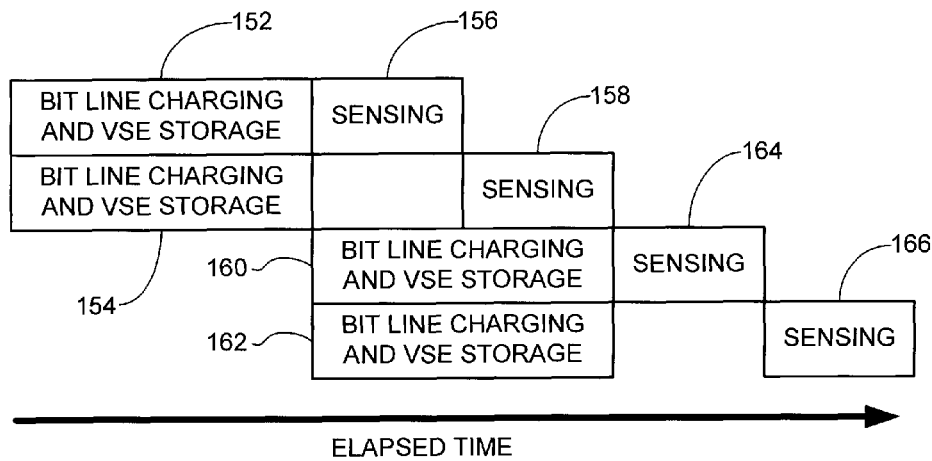
FIG. 7 provides an associated timing diagram to generally illustrate a sequence of FIG. 6.

FIG. 7 shows a generalized timing representation for the operation of FIG. 6 in accordance with some embodiments. A first bit line charging and VSE storage block 152 represents the time required to store associated read voltages in VSEs for a first set of memory cells. A second bit line charging block 154 corresponds to the same operations being carried out for a second set of memory cells. It is noted that both blocks 152 and 154 are carried out at the same time, and each of the sets of memory cells can be any number of cells, including just a single cell or a relatively large number of cells (including an entire sector or more).

A first sensing operation thereafter takes place at block 156 for the first set of memory cells, and a second sensing operation takes place at block 158 for the second set of memory cells. It will be noted that the sensing operation at block 158 immediately follows that of block 156.

During the sequential sensing operation of blocks 156, 158, a third set of memory cells are shown to be accessed at block 160 and a fourth set of memory cells are being concurrently accessed at block 162. The operations of blocks 160, 162 are nominally the same as carried out by blocks 152, 154. Sequential sensing operations are then carried out as shown at 164, 166.

In this way, after the initial bit line charging and VSE storage, the substantially upper limit on how quickly data can be output from the array will generally be determined in relation to how quickly the sense amplifier can be enabled and operated, since the scheme attempts to obtain constant operation of the sense amplifier without delays or intervening latencies. This constant operation of the sense amplifier is represented in FIG. 7 by the serial cascade of sense blocks 156, 158, 164, 166. It will be appreciated that the process of FIG. 7 continues until all desired blocks have been read.

The numbers of cells concurrently accessed during each of the access blocks 152, 154, 160, 162 can be selected in relation to the operational speed characteristics of the sense amplifier, and the time required to place such cells into a state whereby the read voltages can be stored by the VSEs. Different modes can be selectively enacted as desired for different environmental conditions (such as low power mode, high performance mode, etc.).

However, so long as the storage of the read voltages in the VSEs stays ahead of the operation of the sense amplifier, no further benefit may be generally gained by further increasing the rate at which the MTJs are accessed. The present scheme can provide significant power savings while maintaining exceptionally fast read operations without the need to incorporate costly features into the array to reduce the bit line charging time (such as through the use of amplifiers, current mirroring, etc.) as in the prior art. While a single sense amplifier 146 is shown in FIG. 6, it will be appreciated that in alternative embodiments, multiple sense amplifiers can be configured in parallel to simultaneously operate to respectively output serialized voltage states to further increase read rate performance.

Referring again to FIG. 6, it will be recalled that once the read voltage for a selected MTJ 120 has been stored by the corresponding VSE 140, there is no further need for the application of bias current to the MTJ to hold this voltage, so a given source 142 can be switched at that point to begin the charging of a different MTJ. Similarly, once the voltage on a given VSE 140 has been sensed by the sense amplifier 146, there is generally no longer any reason to maintain this voltage, and so this voltage can be applied back to the bit line to help with the bit line pre-charging for the next set of MTJs 120. The released VSE 140 is further free to be used to store the read voltage for a subsequent memory cell. These various operations can be respectively carried out by the selected configuration of the various switching transistors 144 in FIG. 6.

Figure 8:
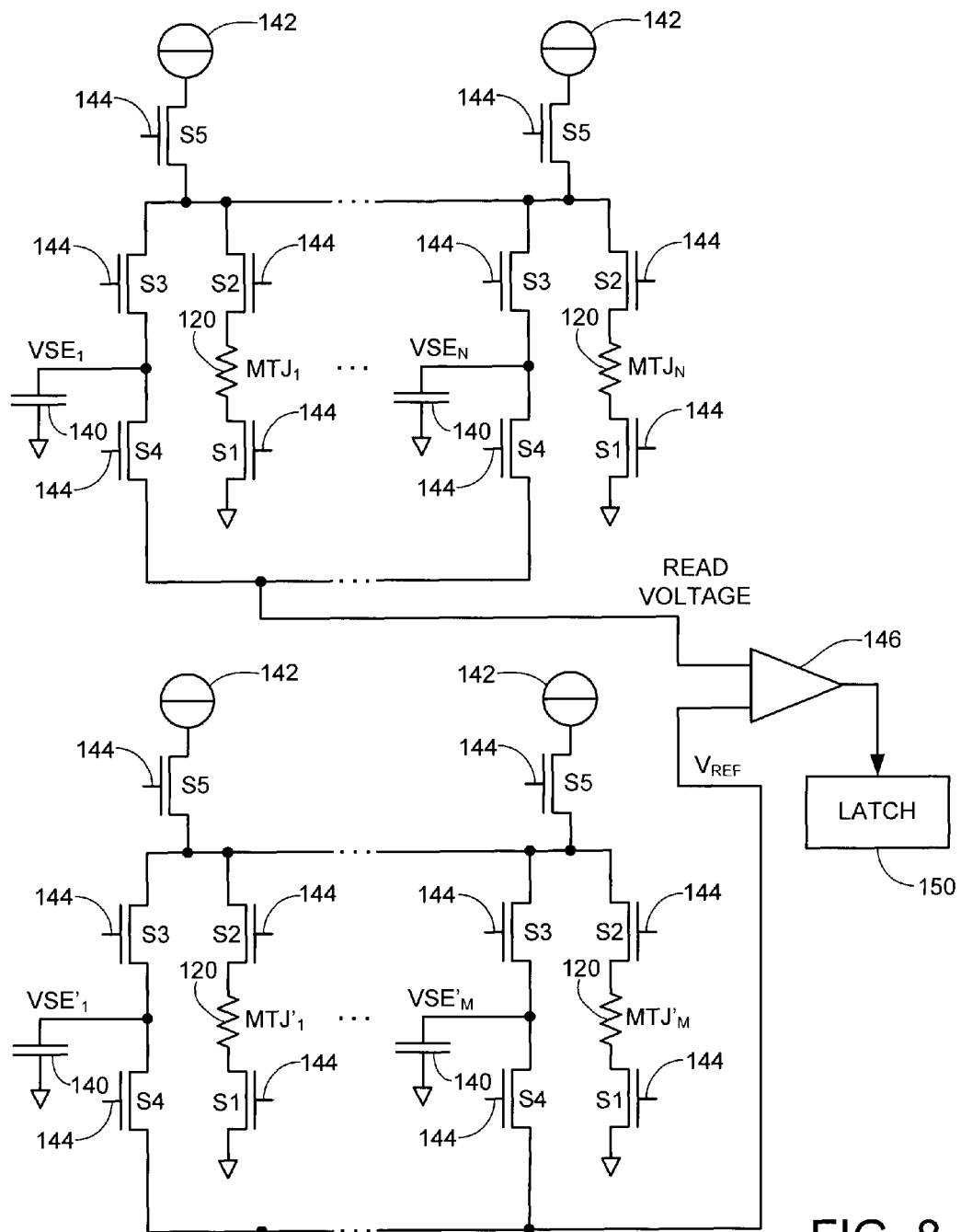
FIG. 8 provides a schematic representation of another manner in which data are read from the memory array in accordance with various embodiments in which a dummy reference is used.

FIG. 8 provides an alternative schematic diagram representation of various embodiments of the present invention. FIG. 8 is generally similar to FIG. 6, and like reference numerals have been utilized to identify similar components. Instead of the external reference scheme of FIG. 6, however, FIG. 8 uses a dummy reference scheme wherein a number of dummy memory cells are supplied to generate the appropriate $V_{REF}$. In one embodiment, some proportion of the dummy cells store a first value (such as corresponding to a logical 1) and the remaining dummy cells store a second value (such as corresponding to a logical 0). By reading out and combining the respective values, an intermediary voltage level therebetween can be readily generated. This intermediary voltage level can be used as the $V_{REF}$ value to differentiate between the stored states of the data cells.

Figure 9:
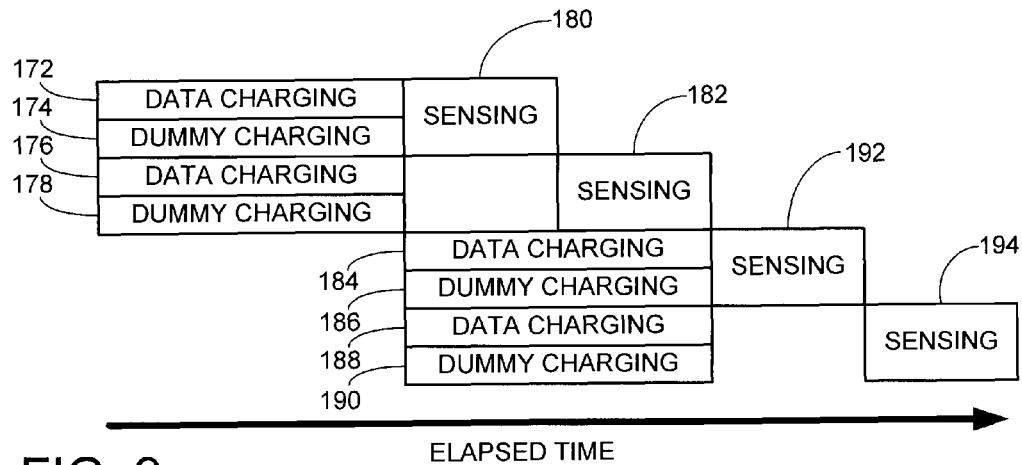
FIG. 9 provides an associated timing diagram to generally illustrate a sequence of FIG. 8.

FIG. 8 provides N data cells ($MTJ_1$ to $MJT_N$) to store data and M dummy cells ($MTJ_1'$ to $MTJ_M'$) to store dummy values used to generate $V_{REF}$ or other suitable values. For reference, N can be equal to M, or N can be greater or less than M, as desired. As in FIG. 6, VSEs 140 are coupled to the respective MTJs 120 to store read voltages therefrom. Both the read voltage and the $V_{REF}$ are stored in respective VSEs 140 for each sense operation. A corresponding timing diagram is set forth by FIG. 9.

Bit line charging and VSE storage operations take place simultaneously for sets of data cells and dummy cells in blocks 172, 174, 176 and 178, respectively. Sensing operations take place serially at blocks 180 and 182 to sequentially output the data in relation to the sensed read voltages and reference voltages stored during blocks 172, 174, 176 and 178. A next set of data cell and dummy cell bitline charging operations take place at blocks 184, 186, 188 and 190 during the sensing operations of blocks 180, 182, and a next set of sensing operations occur at blocks 192, 194. As before, once the initial bit line charging and other processing is carried out, the sequential sensing of the data takes place substantially continuously without delay, latency or interruption, as shown by cascaded sensing blocks 180, 182, 192 and 194.

Figure 10:
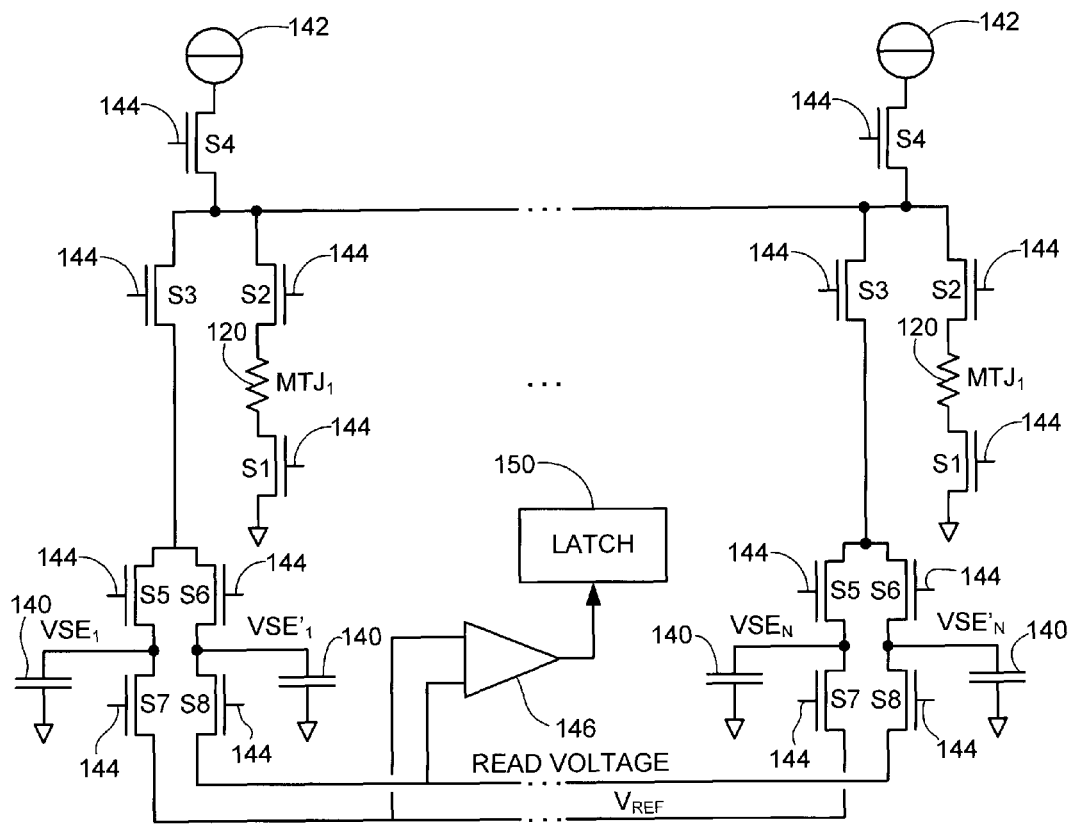
FIG. 10 provides a schematic representation of yet another manner in which data are read from the memory array in accordance with various embodiments in which a self-reference is used.

FIG. 10 provides yet another alternative embodiment in which a self-reference scheme is employed. Generally, two VSEs 140 are utilized for each MTJ 120, one storing a read voltage and the other storing a reference voltage ($V_{REF}$). The circuitry otherwise generally operates in a manner similar to that set forth above for FIGS. 6 and 8. A corresponding timing diagram for the circuitry of FIG. 10 is shown in FIG. 11.

Figure 11:
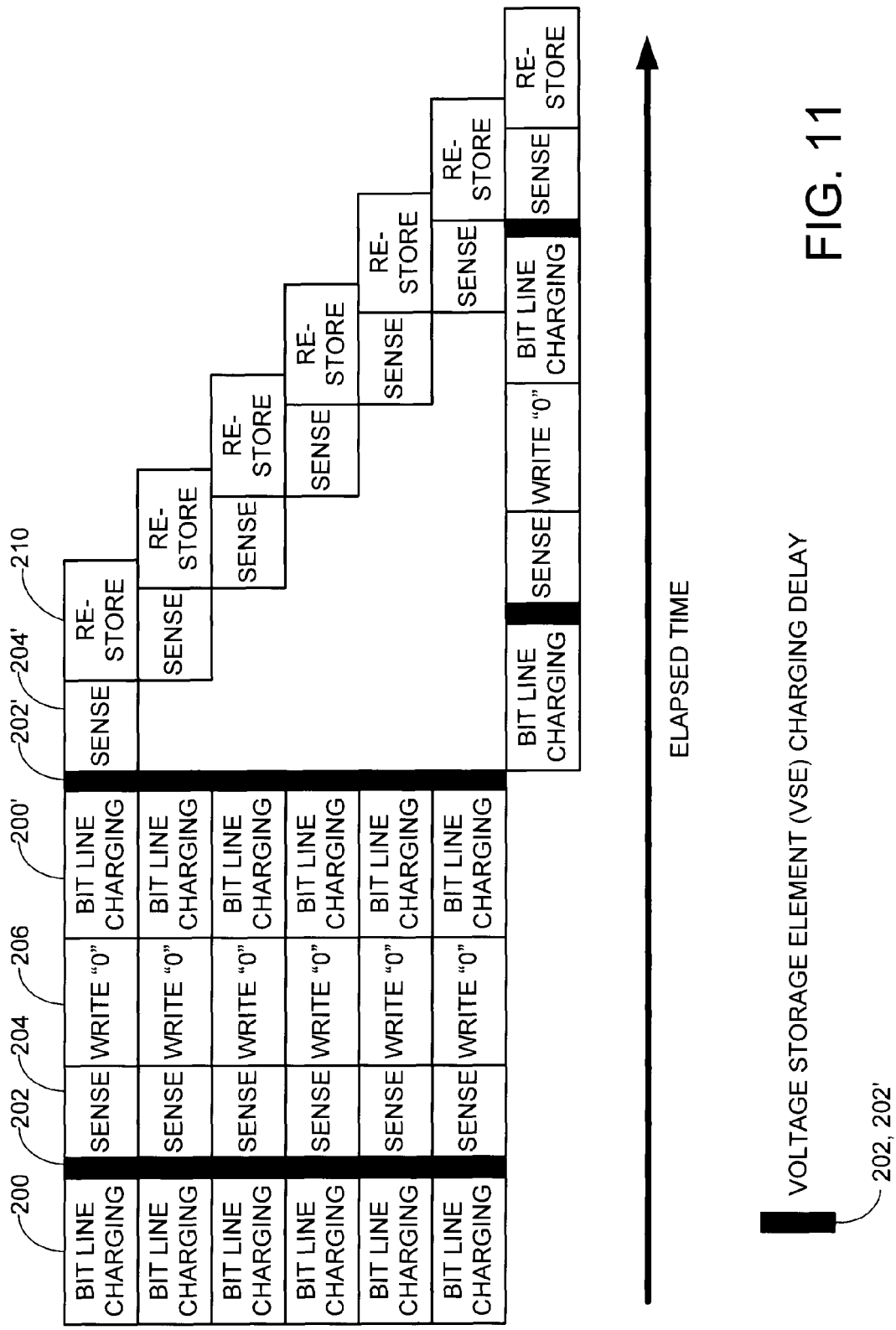
FIG. 11 provides an associated timing diagram to generally illustrate a sequence of FIG. 10.

In FIG. 11, the steps carried out for a given MTJ 120 are set forth by each row. These steps include a bit line charging block 200, a latency delay at block 202 while a first one of the VSEs 140 is being charged to store the read voltage from the MTJ, and a sense operation 204 during which the value from the VSE is read. A write "0" operation is next carried out at block 206, followed by a second bit line charging block 200', a second latency delay 202', and a second sense operation 204'. A restore operation 210 then returns the MTJ to its original value. This sequence of steps is carried out simultaneously for a number of cells, as shown.

This self-reference maintains a certain amount of processing overhead in that the operation involves various read/write operations, and latency delays while the VSEs 140 are charged. Nevertheless, it will be noted from FIG. 11 that the sensing operations are controlled so as to be carried out in continuously sequential fashion, as indicated by the diagonal arrangement of the second sense operations 204'.

It will now be appreciated that the various embodiments presented herein provide an upstream pipeline sensing scheme whereby generally, parallel processing takes place for multiple cells to enable the sensing circuitry to operate continuously and sequentially to output memory states for such cells. While STRAM and RRAM have been contemplated in accordance with various embodiments, it will be appreciated that other constructions of memory cells can be readily used.

For purposes of the appended claims, the featured "first means" will be understood consistent with the foregoing discussion to correspond at least to the structure of FIGS. 1, 6, 8 and 10. The circuitry in these figures generally operates to carry out a pipeline sense operation to read data from the array by simultaneously applying bias currents to a first set of memory cells from the array while storing read voltages generated thereby in a corresponding first set of VSEs, and then sequentially comparing the read voltages stored in said first set of VSEs with at least one reference value to serially output a logical sequence corresponding to the memory states of the first set of memory cells.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
   storing a read voltage from a first memory cell in a voltage storage element (VSE);
   comparing the read voltage to a reference voltage to identify a corresponding memory state of the first memory cell; and
   storing a second read voltage from a second memory cell in a second VSE during the comparing step to carry out a pipeline sensing operation upon the first and second memory cells.

2. The method of claim 1, wherein the first storing step comprises applying a bias current to the first memory cell and coupling the VSE to the first memory cell to store the read voltage therefrom.

3. The method of claim 1, wherein the comparing step comprises coupling the VSE to a first sense input of a sense amplifier, applying the reference voltage to a second sense input of the sense amplifier, and operating the sense amplifier to output a logical value indicative of the memory state of the first memory cell in relation to the first and second sense inputs.

4. The method of claim 1, wherein a plurality of read voltages from a first set of memory cells are simultaneously stored in respective VSEs during the first storing step, and wherein said plurality of read voltages are sequentially sensed by a sense amplifier during the comparing step.

5. The method of claim 4, wherein a second plurality of read voltages from a second set of memory cells are simultaneously stored in respective VSEs during the comparing step for subsequent sensing by said sense amplifier.

6. The method of claim 1, wherein the reference voltage of the comparing step is supplied from an external reference source.

7. The method of claim 1, wherein the reference voltage of the comparing step is stored in a third VSE.

8. The method of claim 1, wherein the first and second VSEs each comprise a capacitor coupled to a bit line adjacent the respective memory cells.

9. The method of claim 1, wherein the respective memory cells each comprise a magnetic tunneling junction (MTJ).

10. An apparatus comprising a memory array of semiconductor memory cells, and a control circuit which carries out a pipeline sense operation to read data from the array by simultaneously applying bias currents to a first set of memory cells from the array while storing read voltages generated thereby in a corresponding first set of voltage storage elements (VSEs), and then sequentially comparing the read voltages stored in said first set of VSEs with at least one reference value to serially output a logical sequence corresponding to the memory states of the first set of memory cells.

11. The apparatus of claim 10, wherein the control circuit further operates to simultaneously apply bias currents to a second set of memory cells from the array and store read voltages generated thereby in a second set of VSEs during said sequential comparison of the read voltages stored in the first set of VSEs.

12. The apparatus of claim 11, wherein the control circuit further operates to sequentially compare the read voltages stored in said second set of VSEs with at least one reference value to serially output a logical sequence corresponding to the memory states of the second set of memory cells.

13. The apparatus of claim 10, wherein the control circuit comprises a sense amplifier which carries out said sequential comparison.

14. The apparatus of claim 10, further comprising an external reference source which generates the at least one reference voltage.

15. The apparatus of claim 10, wherein the at least one reference voltage is stored in a separate VSE.

16. The apparatus of claim 10, wherein once the read voltage stored in a selected VSE is read, the control circuit further operates to transfer the read voltage from the VSE back to the bit line to assist in pre-bitline charging for a read operation on a different memory cell in the array.

17. The apparatus of claim 10, wherein the respective memory cells each comprise a magnetic tunneling junction (MTJ).

18. A method comprising:
    storing a read data value from a first memory cell in a first voltage storage element (VSE);
    comparing the read data value to a reference value to identify a corresponding memory state of the first memory cell; and
    storing a second read data value from a second memory cell in a second VSE during the comparing step to carry out a pipeline sensing operation upon the first and second memory cells.

19. The method of claim 18, wherein the first and second VSEs are each characterized as a capacitor.

20. The method of claim 18, wherein the respective memory cells each comprise a magnetic tunneling junction (MTJ).

* * * * *